United States Patent
Schuster

(10) Patent No.: US 6,842,005 B2
(45) Date of Patent: Jan. 11, 2005

(54) GRADIENT COIL SYSTEM AND MAGNETIC RESONANCE DEVICE WITH THE GRADIENT COIL SYSTEM

(75) Inventor: Johann Schuster, Oberasbach (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/678,808

(22) Filed: Oct. 3, 2003

(65) Prior Publication Data
US 2004/0113618 A1 Jun. 17, 2004

(30) Foreign Application Priority Data
Oct. 4, 2002 (DE) ......................................... 102 46 310

(51) Int. Cl.⁷ .............................................. G01V 3/00
(52) U.S. Cl. .................................... 324/318; 324/322
(58) Field of Search ............................... 324/318, 322, 324/300, 306, 307, 309, 312, 314

(56) References Cited

U.S. PATENT DOCUMENTS

| 4,636,729 A |   | 1/1987  | Maurer et al. |
|---|---|---|---|
| 4,642,569 A | * | 2/1987  | Hayes et al. ................ 324/318 |
| 5,084,676 A | * | 1/1992  | Saho et al. ................. 324/318 |
| 5,200,701 A |   | 4/1993  | Siebold et al. |
| 5,331,281 A | * | 7/1994  | Otsuka ....................... 324/318 |
| 5,332,972 A | * | 7/1994  | Takenouchi ................. 324/318 |
| 5,414,360 A |   | 5/1995  | Westphal et al. |
| 5,414,368 A |   | 5/1995  | Ogawa et al. |
| 5,570,021 A |   | 10/1996 | Dachniwskyj et al. |
| 5,576,623 A | * | 11/1996 | Muller ....................... 324/318 |
| 5,729,141 A | * | 3/1998  | Hass et al. .................. 324/318 |
| 6,107,799 A |   | 8/2000  | Sellers et al. |
| 6,531,870 B2 |  | 3/2003  | Heid et al. |
| 6,570,021 B2 |  | 5/2003  | Buforn et al. |

FOREIGN PATENT DOCUMENTS

| DE | OS 197 22 211 | 8/1998 |
|---|---|---|
| EP | 0 362 931 | 4/1990 |
| WO | WO 97/35214 | 9/1997 |

OTHER PUBLICATIONS

U.S. Patent Application Publication 2003/0016015—Jan. 23, 2003.

* cited by examiner

Primary Examiner—Louis Arana
(74) Attorney, Agent, or Firm—Schiff Hardin LLP

(57) ABSTRACT

A gradient coil system has at least two structurally independent units each forming a part of the sub-coils of the gradient coils of the gradient coil system, and a carrier in which the units are attached separated from one another for an antenna system that can be arranged between them.

25 Claims, 3 Drawing Sheets

GRADIENT COIL SYSTEM AND MAGNETIC RESONANCE DEVICE WITH THE GRADIENT COIL SYSTEM

BACKGROUND OF THE INVENTION

1. Field of the Invention

The invention concerns a gradient coil system and a magnetic resonance device with such a gradient coil system.

2. Description of the Prior Art

Magnetic resonance technology is a known technology for, among other things, acquiring images of the inside of a body of an examination subject. In a magnetic resonance device, rapidly switched gradient fields that are generated by a gradient coil system are superimposed on a static basic magnetic field that is generated by a basic field magnet. The magnetic resonance device also has a radio-frequency system that emits radio-frequency signals into the examination subject to excite magnetic resonance signals and acquires the excited magnetic resonance signals, on the basis of which magnetic resonance images are generated.

For example, an assembly for a gradient coil system shaped like a hollow cylinder with shielding coils is described in German OS 197 22 211. The gradient coil system thereby comprises from the inside out the following elements, that are fashioned in hollow-cylindrical regions arranged concentric to one another: a first transversal gradient coil, a second transversal gradient coil, a first coolant device, a longitudinal gradient coil, a shim assembly group, a second coolant device, a longitudinal shielding coil, a first transversal shielding coil, and a second transversal shielding coil. These elements are encapsulated in an opening of the gradient coil system.

A magnetic resonance device is known from German OS 197 22 481 in which a basic field magnet has a first surface and a gradient coil system has a second surface, the surfaces facing one another being separated from one another, and a noise reduction device is arranged in contact with both surfaces to damp the oscillations of the gradient coil system and/or to stiffen or reinforce the gradient coil system. In an embodiment, to form a closed, sealed space between the two surfaces, the noise reduction device has suitable seals, this space being filled with sand, foam, a fluid under pressure, or other oscillation-damping and/or stiffening materials. In another embodiment, the noise reduction device has a number of cushions that can be filled with one of the aforementioned materials. In another embodiment, in a basic field magnet having a cylindrical, hollow opening, in which a hollow-cylindrical gradient coil system is arranged, the noise reduction device is formed by wedges that are distributed between the two surfaces.

A magnetic resonance device with a gradient coil system is known from German OS 101 56 770, in which an electrically conductive structure is arranged and fashioned such that a magnetic field of the structure caused by a gradient field by induction is similar to the gradient field, at least within the imaging volume of the magnetic resonance device. In an embodiment, a part of the structure is fashioned substantially barrel-shaped as a component of the basic field magnet. Among other things, the gradient coil system can be fashioned without shielding coils, since the undesired consequences of the switched gradient fields, due to the similarity of the magnetic field caused by the structure, can be completely controlled by a pre-emphasis (pre-distortion/deformation).

SUMMARY OF THE INVENTION

It is an object of the present invention to provide an improved gradient coil system in which at least two structurally independent units of the gradient coil system are arranged such that a predeterminable distance can be exactly adjusted and permanently maintained between the units.

The object is inventively achieved in a gradient coil system having at least two structurally independent units, each having parts of the sub-coils of the gradient coils of the gradient coil system, and a carrier to which the units are attached, separate from one another, for an antenna system that can be arranged between them.

Due to the use of the carrier, in which the units are attached such that between them a free space exists with the predeterminable separation, a handling of the gradient coil system as a whole (i.e., a transportation, installation and assembly) is possible without requiring further regard to the exactly maintained separation.

DESCRIPTION OF THE PREFERRED EMBODIMENTS

Figure 1:
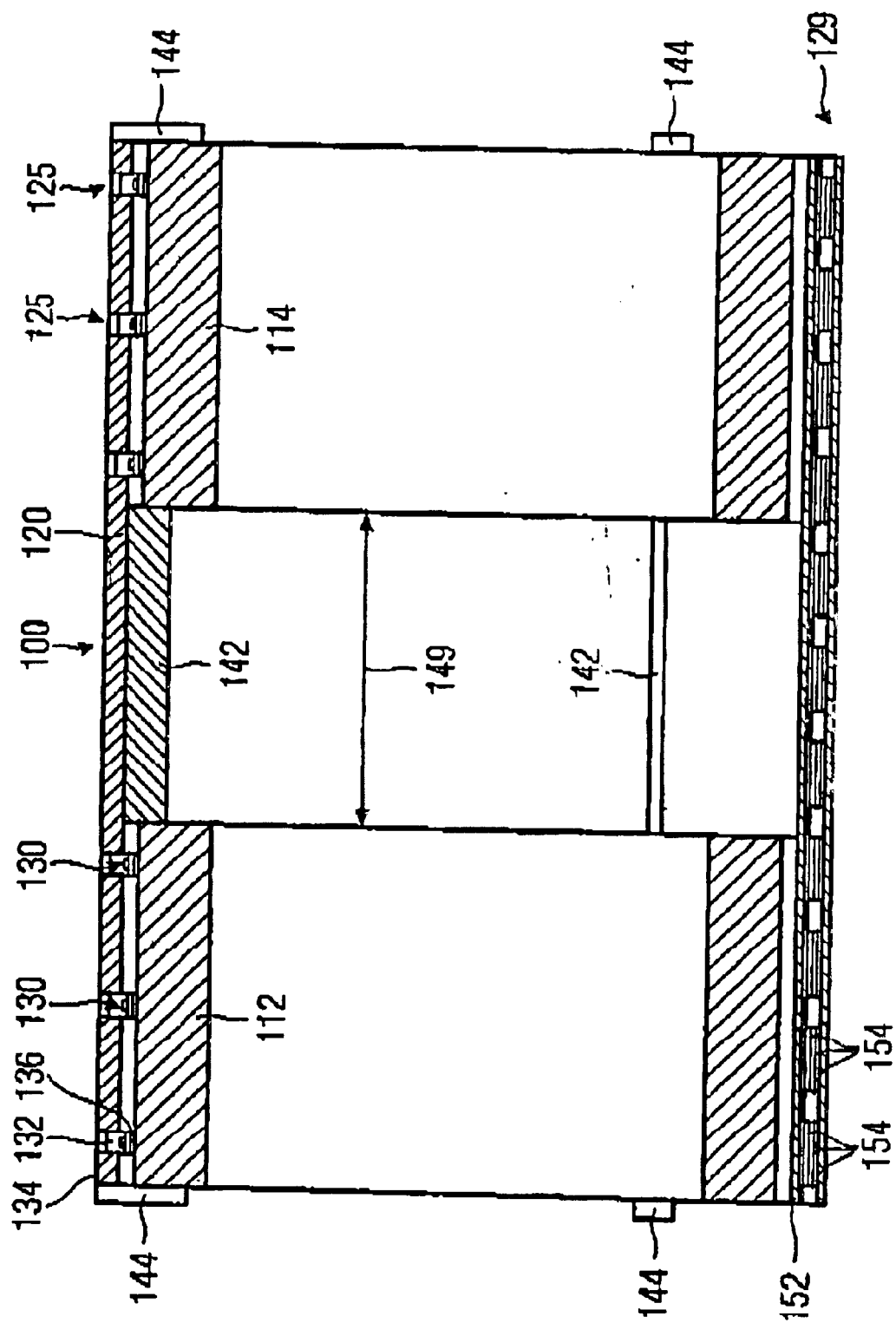
FIG. 1 is a longitudinal section through a gradient coil system, in which two structurally independent units forming the sub-coils of gradient coils are attached in a carrier by adjusting screws in accordance with the invention.

FIG. 1 shows as an exemplary embodiment of the invention a longitudinal section through a gradient coil system 100 shaped substantially like a hollow cylinder. The gradient coil system 100 has two structurally independent units 112 and 114 shaped as hollow cylinders. Each of the units 112 and 114 forms a part of the sub-coils of gradient coils of the gradient coil system 100. Each of the units 112 and 114 thus has saddle-shaped sub-coils of a first transversal gradient coil, two further saddle-shaped sub-coils of a second transversal gradient coil, and a solenoid-like partial coil of a longitudinal gradient coil. The units 112 and 114 correspond, for example, to those described in the above-cited German OS 197 22 211, produced with a typical vacuum flow method.

The gradient coil system 100 also has a carrier 120 produced from a glass and/or carbon fiber-reinforced synthetic. The carrier 120 has a passive shim system, for which purpose the carrier 120 is fashioned with suitable acceptance openings 129 for insertion of shim carriers 152 with ferromagnetic shim elements 154. The plate-like shim elements 154 are screwed down or adhered to the shim carrier 152. In another embodiment, the shim elements 154 can fill shim boxes.

Furthermore, the carrier 120 has on both sides of a middle region, in a region bordering the units 112 and 114, bores 125 with a threading to guide adjusting screws 130, distributed both in the longitudinal direction and in the circumferential direction. At least three rows of bores 125 distributed in the circumferential direction, with at least three bores 125 per row, are provided in each unit 112 and 114. The units 112 and 114 are fixed to the carrier 120 by adjusting screws 130. The fixing can be set as soft or hard by the fastening torque of the adjusting screws 130, dependent on the use of the gradient coil system 100. A transmission of mechanical oscillations that arise from the operated units 112 and 114 to the carrier 120, to other components of a magnetic resonance device in which the gradient coil system 100 is fixed, can thereby be minimized. Each of the adjusting screws 130 has a threaded bolt 132 and a pressure plate 134. The pressure plate 134 has an application of rubber or synthetic.

To transmit radio-frequency signals and to receive magnetic resonance signals, a specially fashioned antenna system is provided for mounting between the two units 112 and 114. For this purpose both units 112 and 114 are adjusted in the longitudinal direction to an exact separation of a predeterminable distance measurement from one another. For this, in the middle region of the carrier 120 at least three spacers 142 are attached to the carrier 120, arranged distributed in the circumferential direction, at which, with regard to the longitudinal direction, both sides of the units 112 and 114 are adjacently arranged, such that an exact separation of the units 112 and 114 from one another corresponding to the separation measurement is ensured. Furthermore, both units 112 and 114 are fixed for additional support in the longitudinal direction at the front of the carrier 120 via securing elements 144 attached to the carrier 120, for example by bolts. Magnetic resonance imaging compatibility, i.e. the use of non-magnetic materials, is important for all components, in particular the adjusting screws 130, the spacers 142, and the securing elements 144.

Figure 2:
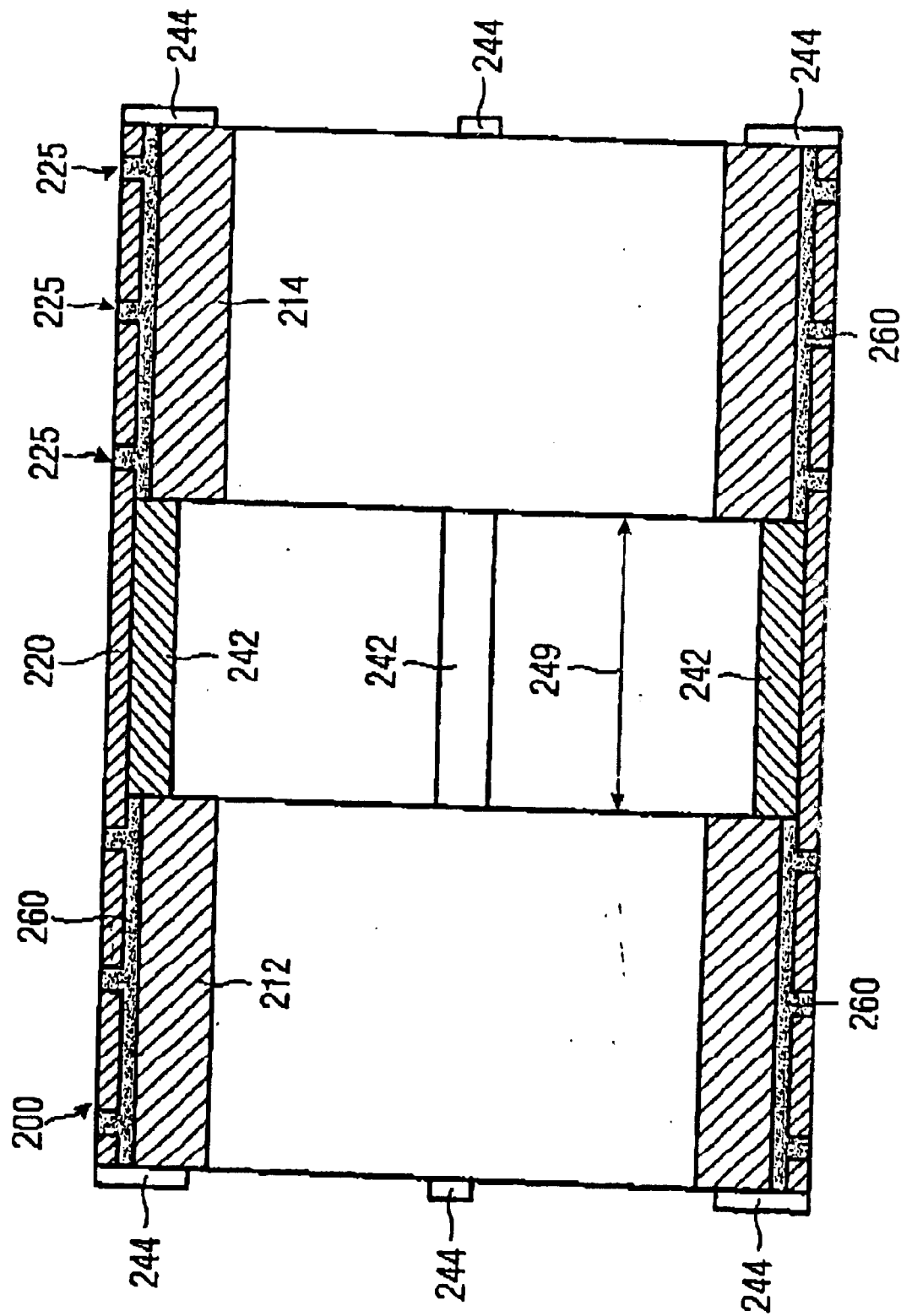
FIG. 2 is a longitudinal section through a gradient coil system, in which two structurally independent units forming the sub-coils of gradient coils are fixed in a carrier via an adhesive applied between the units and the carrier in accordance with the invention.

FIG. 2 shows as a further exemplary embodiment of the invention a longitudinal section through a further gradient coil system 200 shaped substantially as a hollow cylinder. The gradient coil system 200 has two structurally independent units 212 and 214. Each of the units 212 and 213 has a part of the sub-coils of gradient coils of the gradient coil system 200. Furthermore, the gradient coil system 200 has a carrier 220 produced from a glass and/or carbon fiber-reinforced synthetic. In a middle region of the carrier 220, four spacers 242 distributed in the circumferential direction are attached to the carrier 220, at which, with regard to a longitudinal direction, both sides of the units 212 and 214 are adjacently arranged, such that an exact separation of the units 212 and 214 from one another with a distance measurement 249 is ensured. Furthermore, both units 212 and 214 are fixed for an additional support in the longitudinal direction to the front of the carrier 220 via securing elements 244 attached to the carrier 220, for example via by bolts. The preceding description for FIG. 2 thereby corresponds substantially so far to that described for FIG. 1.

A difference in the exemplary embodiment of FIG. 2 from FIG. 1 is that both units 212 and 214 are not connected with the carrier 220 via adjusting screws 130, but instead both units 212 and 214 are attached to the carrier 220 by the application of an adhesive 260 between the surfaces of the two units 212 and 214 directly facing one another and the carrier 220. For the application of the adhesive 260 (in a fluid state), the carrier 220 has in the area of the units 212 and 214, per unit 212 and 214, four rows of three bores 225 each distributed in the circumferential direction. The adhesive can be applied between the units 212 and 214 and the carrier 220 via the bores 225 and the annular gaps at the front of the gradient coil system 200. Given an injection of the adhesive 260 via the bores 225, separations of less than 4 mm can be realized in a gradient coil system 200 designed for whole-body exposures of patients. Given larger separations, a filling is also possible via aforementioned ring gaps, such that the bores 225 can be forgone.

Pourable sealing compounds (for example silicon-based) and other adhesives of various types (thus also polyurethane foams) can be used as the adhesive 260. Physically setting adhesives (for wet bonding, contact bonding, activated bonding and pressure sensitive bonding) and chemically setting adhesives (for reaction bonding, having chemically hardening adhesives, for example a hardening resin) are suitable.

Furthermore, an adhesive with a melting temperature between approximately 50° C. and 90° C., for example a wax or a similar material with a low melting point, can be used as the adhesive 260. In normal operation of the gradient coil system 200, it is ensured by an appropriate corresponding control of the currents in the sub-coils and a coolant unit (present if necessary) that a temperature on the outer cylinder jacket of the units 212 and 214 is sufficiently far from the melting point of the wax. For non-destructive removal of the units 212 and 214 from the carrier 220, it is merely necessary to heat the outer jacket of the units 212 and 214 above the melting point of the adhesive 260. For this purpose, suitable currents can be set in the sub-coils. In another embodiment, the gradient coil system 200 is provided with an additional heating device. It is thus possible to reversibly and non-destructively install and remove the units 212 and 214.

Figure 3:
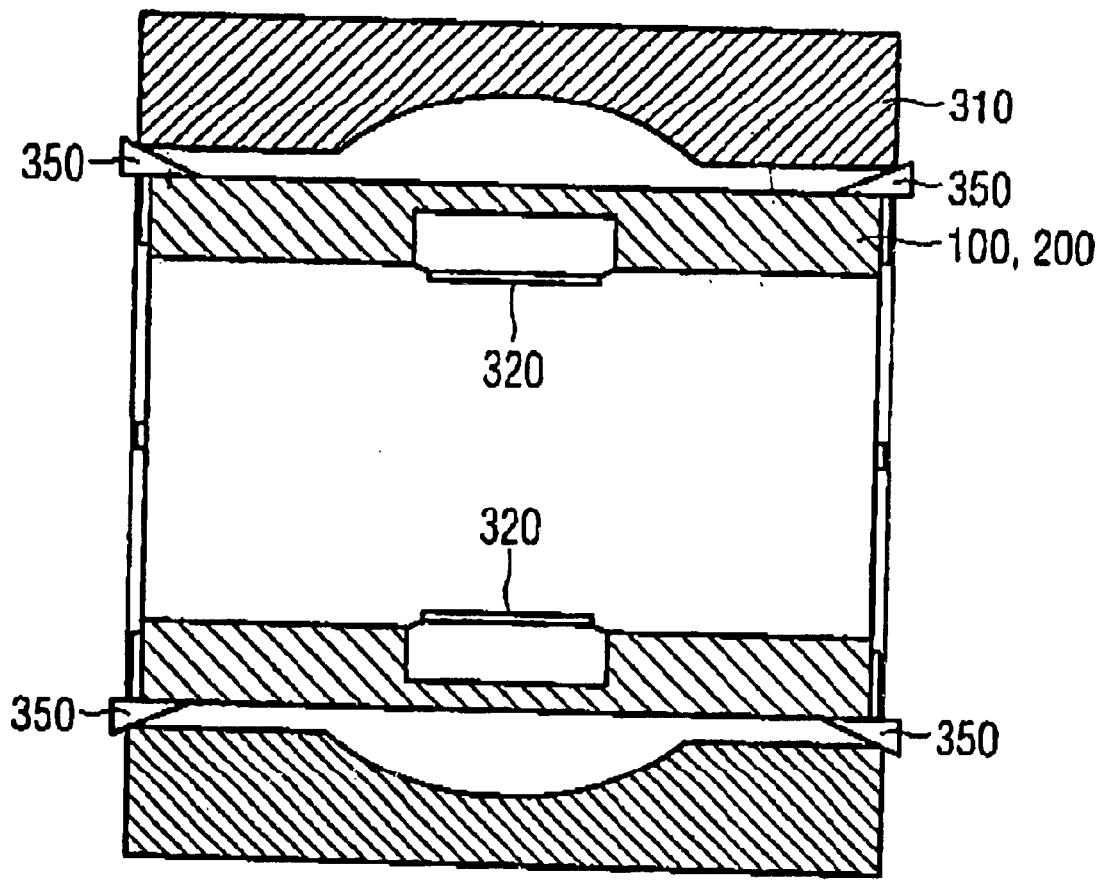
FIG. 3 is a longitudinal section through a magnetic resonance device with a gradient coil system according to FIG. 1 or 2 that is fixed in the middle region of a barrel-shaped bulging hollow of a basic field magnet.

FIG. 3 shows another exemplary embodiment of the invention making use of one of the gradient coil systems 100 or 200 as described above in a magnetic resonance device with a basic field magnet 310, having an opening that is distended in the shape of a barrel in a middle region and is fashioned cylindrically in edge regions that connect to both sides of the middle region. The basic field magnet 310 is thereby, for example, designed corresponding to German OS 101 56 770, cited above. In the cavity of the basic field magnet 310, one of the gradient coil systems 100 or 200 is installed to generate gradient fields. To transmit radio-frequency signals and to receive magnetic resonance signals, a specially fashioned antenna system 320 is arranged between the two units 112 and 114 or 212 and 214 of the gradient coil system 100 or 200. The gradient coil system 100 or 200 is thereby, for example, attached in the cavity by wedges 350, corresponding to German OS 197 22 481 cited above. In another embodiment, the gradient coil system 100 or 200 is attached in the basic field magnet 310 as shown in FIG. 2 for the attachment of the units 212 and 214 in the carrier 220. This formation thereby enables a simpler attachment of the gradient coil system 100 or 200 (with two structurally independent units 112 and 114 or 212 and 214, with the mutual carrier 120 or 220 in the middle region of the cavity bulged like barrel) than would be possible for both units 112 and 114 or 212 and 214 without the carriers 120 or 220.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance gradient coil system for use with a magnetic resonance apparatus having a basic field magnet with a cavity therein, comprising:

a plurality of gradient coils respectively formed by multiple sub-coils;

at least two structurally independent units comprising respective portions of said multiple sub-coils; and a unitary carrier to which said units are attached separated from each other to produce a space between said units adapted to receive a magnetic resonance antenna system between said units, said carrier with said units attached thereto forming an assembly adapted for insertion as a whole into said cavity with said carrier retained in said cavity and said carrier being adapted for mounting said assembly to said cavity.

2. A gradient coil system as claimed in claim 1 wherein said units and said carrier are hollow cylinders.

3. A gradient coil system as claimed in claim 1 wherein said units and said carrier are encapsulated.

4. A gradient coil system as claimed in claim 1 wherein said carrier comprises a shim system.

5. A gradient coil system as claimed in claim 1 wherein said carrier is comprised of a composite material.

6. A gradient coil system as claimed in claim 5 wherein said composite material is selected from the group consisting of glass and carbon fiber reinforced synthetic.

7. A gradient coil system as claimed in claim 1 comprising a separator disposed between said units on said carrier to precisely separate said units from each other on said carrier.

8. A gradient coil system as claimed in claim 7 wherein said separator is attached to said carrier.

9. A gradient coil system as claimed in claim 7 wherein said carrier has a circumference, and wherein said separator comprises at least three spacers distributed circumferentially around said carrier between said units.

10. A gradient coil system as claimed in claim 1 comprising a securing arrangement attached to said carrier that secures said units on said carrier in a direction of the separation between said units.

11. A gradient coil system as claimed in claim 10 wherein said carrier has a front side and wherein said securing arrangement is attached to said front side of said carrier.

12. A gradient coil system as claimed in claim 11 wherein said carrier has a circumference and wherein, at said front side of said carrier, said securing arrangement comprises at least three securing elements circumferentially distributed around said carrier.

13. A gradient coil system as claimed in claim 1 comprising adjusting screws screwed into said carrier for attaching said units to said carrier.

14. A gradient coil system as claimed in claim 13 wherein said adjusting screws comprise, for each of said units, three rows of adjusting screws with at least three adjusting screws per row.

15. A gradient coil system as claimed in claim 14 wherein said carrier has a circumference and wherein said rows are circumferentially distributed around said carrier.

16. A gradient coil system as claimed in claim 14 wherein each of said adjusting screws comprises a threaded bolt and a pressure plate with an application of soft material thereon.

17. A gradient coil system as claimed in claim 16 wherein said material is selected from the group consisting of rubber and plastic.

18. A gradient coil system as claimed in claim 1 comprising an adhesive applied between said units and said carrier for attaching said units to said carrier.

19. A gradient coil system as claimed in claim 18 wherein said carrier comprises a plurality of openings for application of said adhesive.

20. A gradient coil system as claimed in claim 19 wherein said carrier comprises, for each of said units, at least three rows of said openings, with at least three openings per row.

21. A gradient coil system as claimed in claim 20 wherein said carrier has a circumference, and wherein said rows are circumferentially distributed around said carrier.

22. A gradient coil system as claimed in claim 18 wherein said adhesive is selected from the group consisting of silicone adhesives, foam adhesives and adhesive resins.

23. A magnetic resonance apparatus comprising:
a magnetic resonance scanner having a cavity therein adapted to receive an examination subject for obtaining magnetic resonance data from said subject; and
a gradient coil system disposed in said cavity as a whole, said gradient coil system comprising a plurality of gradient coils respectively formed by multiple sub-coils, at least two structurally independent units comprising respective portions of said multiple sub-coils, and a unitary carrier to which said units are attached separated from each other to produce a space between said units adapted to receive a magnetic resonance antenna system between said units, said gradient coil system being mounted to said cavity via said carrier.

24. A magnetic resonance apparatus as claimed in claim 23 wherein said cavity has a barrel-shaped central region, and wherein said gradient coil system, in said central region, conforms to said barrel shape.

25. A magnetic resonance apparatus as claimed in claim 23 further comprising an antenna system attached to said units, disposed between said units on said carrier.

* * * * *